US012803564B2

(12) United States Patent
Fujie et al.

(10) Patent No.: US 12,803,564 B2
(45) Date of Patent: Nov. 17, 2026

(54) ATOMIC OSCILLATOR AND FREQUENCY SIGNAL GENERATION SYSTEM

(71) Applicant: SEIKO EPSON CORPORATION, Tokyo (JP)

(72) Inventors: Masahiro Fujie, Suwa (JP); Yoshiyuki Maki, Suwa (JP); Yasushi Tsuchiya, Fujimi (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 19/225,280

(22) Filed: Jun. 2, 2025

(65) Prior Publication Data

US 2025/0373257 A1 Dec. 4, 2025

(30) Foreign Application Priority Data

Jun. 3, 2024 (JP) ................................ 2024-090227

(51) Int. Cl.
*H03L 7/26* (2006.01)

(52) U.S. Cl.
CPC ...................................... *H03L 7/26* (2013.01)

(58) Field of Classification Search
CPC ........................................................ H03L 7/26
USPC ......................................... 331/3, 94, 1, 94.1
See application file for complete search history.

(56) References Cited

U.S. PATENT DOCUMENTS 9,018,579 B2 * 4/2015 Kasevich ............... G01C 19/58 702/152
2007/0200643 A1 8/2007 Dimarcq et al.
2015/0222285 A1 8/2015 Goka et al.
2016/0352345 A1 * 12/2016 Hashi ........................ H03L 1/04
2022/0179370 A1 6/2022 Danet et al.

FOREIGN PATENT DOCUMENTS

JP 2007-530965 A 11/2007
JP 2014-049886 A 3/2014

* cited by examiner

*Primary Examiner* — Arnold M Kinkead
(74) *Attorney, Agent, or Firm* — Harness, Dickey & Pierce, P.L.C.

(57) ABSTRACT

An atomic oscillator includes a frequency oscillator configured to output an oscillation signal, a light source configured to output incident laser light containing first light and second light based on a modulation signal corresponding to the oscillation signal, an atomic cell configured to encapsulate alkali metal atoms, a light reflector including a mirror configured to change a reflection angle of the incident laser light to cause reflected laser light reflected off the mirror to enter the atomic cell at a predetermined cycle, a photodetector configured to detect transmitted laser light passing through the atomic cell and output a detection signal corresponding to an intensity of the transmitted laser light, and a control circuit configured to control the frequency oscillator based on the detection signal to adjust a frequency of the oscillation signal so that the alkali metal atoms cause an electromagnetically induced transparency phenomenon to occur.

8 Claims, 7 Drawing Sheets

ATOMIC OSCILLATOR AND FREQUENCY SIGNAL GENERATION SYSTEM

The present application is based on, and claims priority from JP Application Serial Number 2024-090227, filed Jun. 3, 2024, the disclosure of which is hereby incorporated by reference herein in its entirety.

BACKGROUND

1. Technical Field

The present disclosure relates to an atomic oscillator and a frequency signal generation system.

2. Related Art

As an oscillator having high-precision oscillation characteristics for a long term, there is a known atomic oscillator that oscillates based on energy transition in alkali metal atoms, such as rubidium and cesium.

JP-A-2014-049886 discloses an atomic oscillator using coherent population trapping (CPT) resonance, which is one of quantum interference effects.

The atomic oscillator disclosed in JP-A-2014-049886 includes an alkali metal cell (atomic cell) that encapsulates an alkali metal, a light source that irradiates the alkali metal cell with laser light, and a photodetector that detects light having passed through the alkali metal cell. Such an atomic oscillator uses CPT resonance caused by irradiating alkali metal atoms with two types of laser light having different wavelengths, and an electromagnetically induced transparency (EIT) phenomenon in which the CPT resonance causes the laser light to pass through the alkali metal without being absorbed thereby. In the atomic oscillator, a steep EIT signal generated in association with the EIT phenomenon is detected by the photodetector and used as a reference signal.

In the atomic oscillator described in JP-A-2014-049886, laser light output from a light source is converted by an acousto-optic modulator (AOM) into pulse laser light, which is radiated to alkali metal atoms at time intervals so that Ramsey resonance occurs. The Ramsey resonance having thus occurred can narrow the resonance linewidth, so that the EIT signal can be detected with high precision.

JP-T-2007-530965 discloses an atomic timepiece using the CPT resonance.

The atomic timepiece disclosed in JP-T-2007-530965 includes a laser source, a modulation module, an interaction cell, and a detection module. The laser source irradiates the interaction cell with a first laser beam and a second laser beam that differ in frequency from each other. The modulation module performs pulse modulation on the intensity of each of the first laser beam and the second laser beam so as to have either a high level or a low level. The interaction cell includes an interaction medium configured with cesium atoms or rubidium atoms. The detection module detects a response signal imparted by the interaction medium to the first laser beam and the second laser beam.

In the atomic timepiece described in JP-T-2007-530965, the laser source is controlled by a control signal generated by a local oscillator and a combiner. A radio frequency signal subjected to the pulse modulation is input to the modulation module, and the atoms of the interaction medium are excited. The response signal thus has an amplitude according to the Ramsey resonance. Performing special processing on the response signal allows an increase in contrast of interference fringes in the Ramsey mode using the Ramsey resonance. Subsequent automatic control of the local oscillator based on the thus processed response signal can enhance the stability of the frequency of an atomic timepiece signal.

JP-A-2014-049886 and JP-T-2007-530965 are examples of the related art.

In recent years, it is required to further enhance the stability of the output frequency of the atomic oscillator.

To use the Ramsey resonance in the methods shown in JP-A-2014-049886 and JP-T-2007-530965, it is necessary to sufficiently increase the extinction ratio between the two types of pulse-modulated laser light to be radiated to the alkali metal atoms. In the methods described in JP-A-2014-049886 and JP-T-2007-530965, however, the pulse modulation is realized by causing a modulation device such as an AOM (acousto-optic modulator) disposed in the laser light path to switch one of the two types of laser light to be radiated the alkali metal atoms to the other. One of the two types of laser light passing along the optical path therefore cannot be sufficiently blocked, so that the extinction ratio may decrease. It is conceivable to block one of the two types of laser light with an optical switch or a shutter provided in the optical path, but there is the same concern. When the extinction ratio decreases, the stability of the output frequency of the atomic oscillator decreases.

It is therefore an object to realize an atomic oscillator capable of increasing the extinction ratio between the two types of laser light to be radiated to the atomic cell to stabilize the output frequency.

SUMMARY

An atomic oscillator according to an application example of the present disclosure includes

- a frequency oscillator configured to output an oscillation signal;
- a light source configured to output laser light containing first light and second light having frequencies different from each other based on a modulation signal corresponding to the oscillation signal;
- an atomic cell configured to encapsulate alkali metal atoms;
- a light reflector including a mirror configured to change an angle of reflection of the laser light and configured to cause the laser light reflected off the mirror to enter the atomic cell at a predetermined cycle;
- a photodetector configured to detect the laser light passing through the atomic cell and output a detection signal corresponding to an intensity of the detected laser light; and
- a control circuit configured to control operation of the frequency oscillator based on the detection signal to adjust a frequency of the oscillation signal so that the alkali metal atoms cause an electromagnetically induced transparency phenomenon to occur.

A frequency signal generation system according to another application example of the present disclosure includes

- the atomic oscillator according to the application example of the present disclosure; and
- a processor configured to process an output signal output from the atomic oscillator.

DESCRIPTION OF EMBODIMENTS

An atomic oscillator and a frequency signal generation system according to the present disclosure will be described below in detail based on an embodiment shown in the accompanying drawings.

1. Atomic Oscillator

An atomic oscillator according to the embodiment will first be described.

1.1. Overview of Atomic Oscillator

Figure 1:
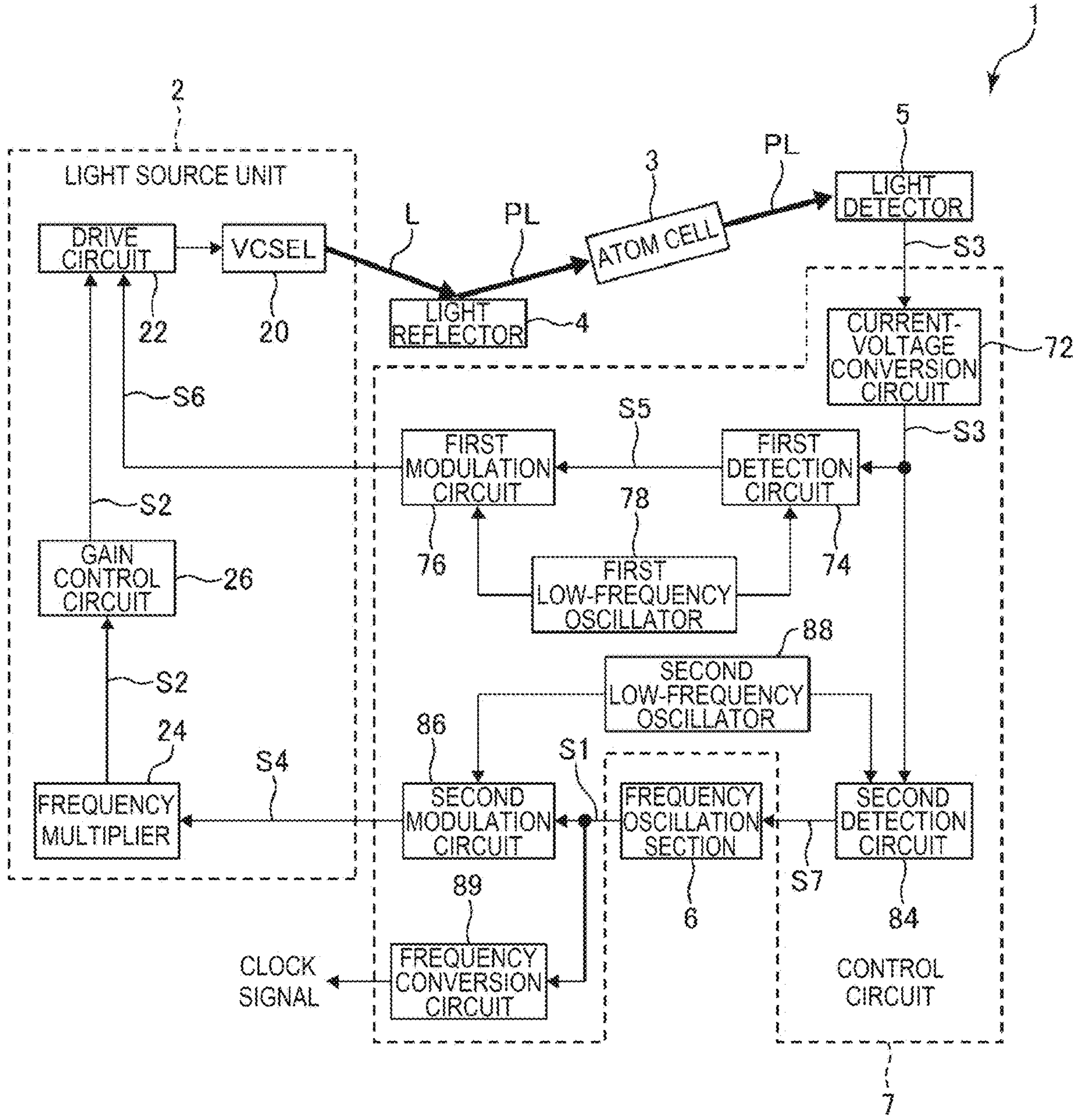
FIG. 1 is a conceptual diagram showing an atomic oscillator according to a first embodiment.

FIG. 1 is a conceptual diagram showing an atomic oscillator 1 according to the embodiment.

The atomic oscillator 1 shown in FIG. 1 is an atomic oscillator using a quantum interference effect (CPT: coherent population trapping) in which simultaneous radiation of with two types of light having different frequencies to alkali metal atoms reduces the amount of the two types of light absorbed by the alkali metal atoms. The quantum interference effect causes an electromagnetically induced transparency (EIT) phenomenon in which the amount of the two types of light passing through the alkali metal atoms increases.

The atomic oscillator 1 shown in FIG. 1 includes a light source 2, an atomic cell 3, a light reflector 4, a photodetector 5, a frequency oscillator 6, and a control circuit 7.

The light source 2 outputs laser light L containing first light and second light having frequencies different from each other based on a modulation signal S2 corresponding to an oscillation signal S1 output by the frequency oscillator 6.

The atomic cell 3 encapsulates multiple kinds of gaseous alkali metal atoms. Examples of the alkali metal atoms may include a cesium atom, a rubidium atom, a sodium atom, and a potassium atom.

The light reflector 4 changes the angle of reflection of the incident laser light L and outputs the reflected laser light L as laser light PL. The light reflector 4 is further configured to change the angle of reflection at a predetermined cycle and cause the laser light PL to enter the atomic cell 3 at the predetermined cycle.

The photodetector 5 detects the laser light PL having passed through the atomic cell 3 and outputs a detection signal S3 according to the intensity of the laser light PL.

The frequency oscillator 6 outputs the oscillation signal S1. The control circuit 7 controls the operation of the frequency oscillator 6 based on the detection signal S3 to adjust the frequency of the oscillation signal S1 so that the alkali metal atoms cause the EIT phenomenon to occur.

1.2. Electromagnetic Induced Transparency (EIT) Phenomenon

Figure 2:
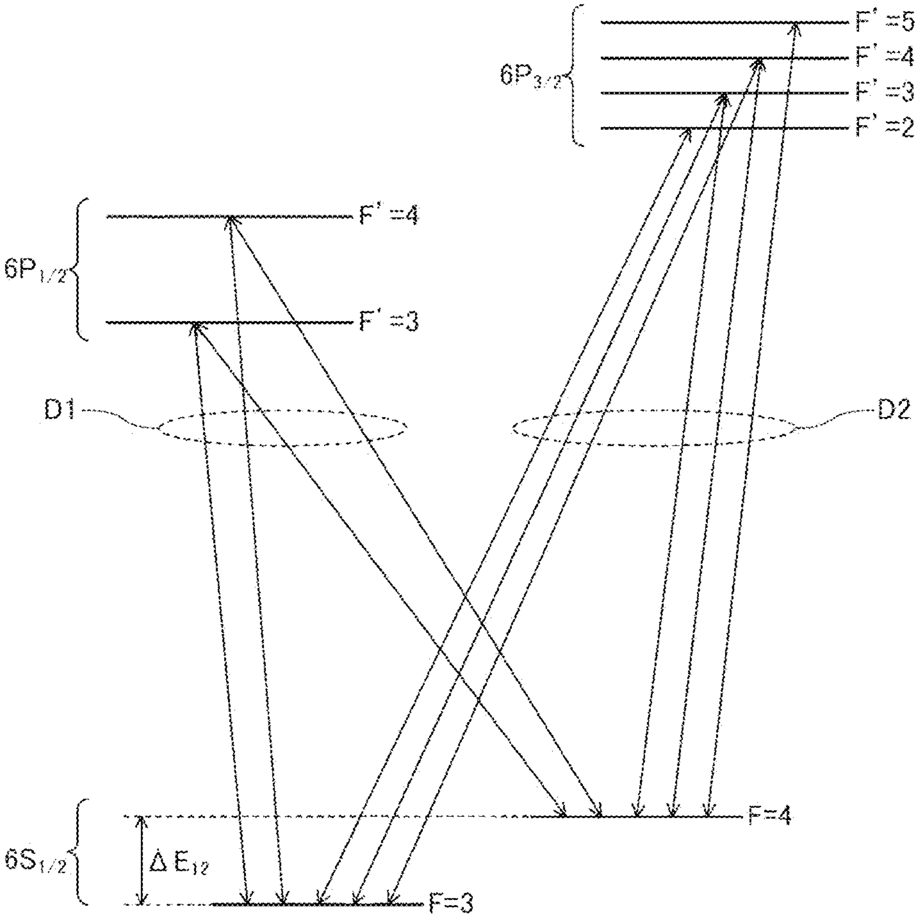
FIG. 2 shows the energy levels of a cesium atom.

FIG. 2 shows the energy levels of a cesium atom. The cesium atom has a ground level $6S_{1/2}$ and two excited levels $6P_{1/2}$ and $6P_{3/2}$, as shown in FIG. 2. The levels $6S_{1/2}$, $6P_{1/2}$, and $6P_{3/2}$ each have an ultrafine structure having multiple divided energy levels. The energy level $6S_{1/2}$ has two ground levels F=3 and 4, the energy level $6P_{1/2}$ has two excited levels F'=3, and 4, and the energy level $6P_{3/2}$ has four excited levels F'=2, 3, 4, and 5.

For example, the cesium atom at the ground level $6S_{1/2}$ F=3 can absorb a D1 line to transition to one of the excited levels $6P_{1/2}$ F'=3 and 4. The cesium atom at the ground level $6S_{1/2}$ F=4 can absorb the D1 line to transition to one of the excited levels $6P_{1/2}$ F'=3 and 4. Conversely, the cesium atom at one of the excited levels $6P_{1/2}$ F'=3 and 4 can emit the D1 line to transition to the ground level $6S_{1/2}$ F=3 or F=4. Three levels including the two ground levels $6S_{1/2}$ F=3 and 4 and one of the excited levels $6P_{1/2}$ F'=3 and 4 are called Λ-type three levels that allow Λ-type transition caused by absorption or emission of the D1 line.

The cesium atom at the ground level $6S_{1/2}$ F=3 can absorb a D2 line to transition to any of the excited levels $6P_{3/2}$ F'=2, 3, and 4, but cannot transition to the excited level F'=5. The cesium atom at the ground level $6S_{1/2}$ F'=4 can absorb the D2 line to transition to any of the excited levels $6P_{3/2}$ F'=3, 4, and 5, but cannot transition to the excited level F'=2. The transitions described above occur based on a transition selection rule on the assumption that the electric dipole transition occurs. Conversely, the cesium atom at one of the excited levels $6P_{3/2}$ F'=3 and 4 can emit the D2 line to transition to the ground level $6S_{1/2}$ F=3 or F=4. Three levels including the two ground levels $6S_{1/2}$ F=3 and 4 and one of the excited levels $6P_{3/2}$ F'=3 and 4, which allow Λ-type transition caused by absorption or emission of the D2 line, form the Λ-type three levels. In contrast, the cesium atom at the excited level $6P_{3/2}$ F'=2 always emits the D2 line to transition to the ground level $6S_{1/2}$ F'=3. Similarly, the cesium atom at the excited level $6P_{3/2}$ F'=5 always emit the D2 line to transition to the ground level $6S_{1/2}$ of F=4. Therefore, three levels including the two ground levels $6S_{1/2}$ F=3 and 4 and the excited level $6P_{3/2}$ F'=2 or F'=5, which do not allow the Λ-type transition caused by absorption or emission of the D2 line, do not form the Λ-type three levels. The alkali metal atoms other than the cesium atom also have two ground levels and one excited level that form the Λ-type three levels.

When the gaseous alkali metal atoms are simultaneously irradiated with the first light and the second light, which differ from each other in frequency by a predetermined value, the EIT phenomenon occurs in the alkali metal atoms.

Figure 3:
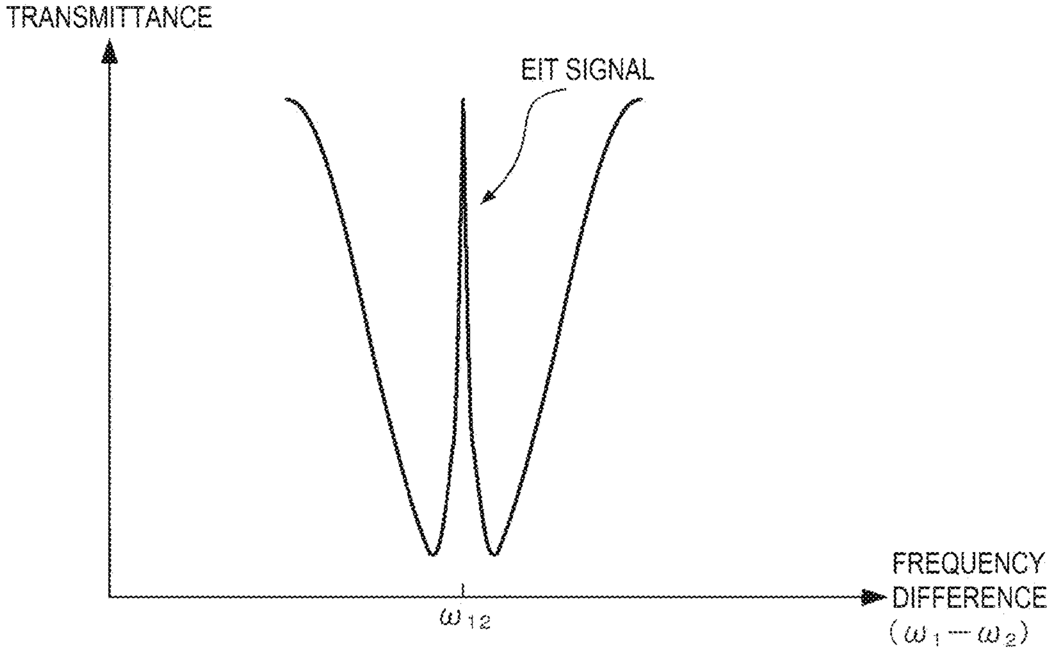
FIG. 3 shows an example of an EIT signal.

When the EIT phenomenon occurs, the photodetector 5 shown in FIG. 1 produces an EIT signal showing that the transmittance of the atomic cell 3 sharply increases. FIG. 3 shows an example of the EIT signal. In FIG. 3, the horizontal axis represents the difference in frequency $\omega_1-\omega_2$ between the first light and the second light, and the vertical axis represents the transmittance at which the atomic cell 3 transmits the light. When the difference $\omega_1-\omega_2$ between the frequency $\omega_1$ of the first light and the frequency $\omega_2$ of the second light coincides with a frequency $\omega_{12}$ corresponding to a difference in energy $\Delta E_{12}$ between the two ground levels shown in FIG. 2, the EIT signal peaks. For example, when a gaseous cesium atom is simultaneously irradiated with as the first light the D1 line that causes the cesium atom to transition from the ground level $6S_{1/2}$ F=3 to the excited level $6P_{1/2}$ F'=4, and as the second light the D1-line that causes the cesium atom to transition from the ground level $6S_{1/2}$ F=4 to the excited level $6P_{1/2}$ F'=4, the EIT phenomenon occurs. The EIT signal is a signal having a very steep waveform and therefore contributes to stabilization of the output frequency of the atomic oscillator 1.

Figure 4:
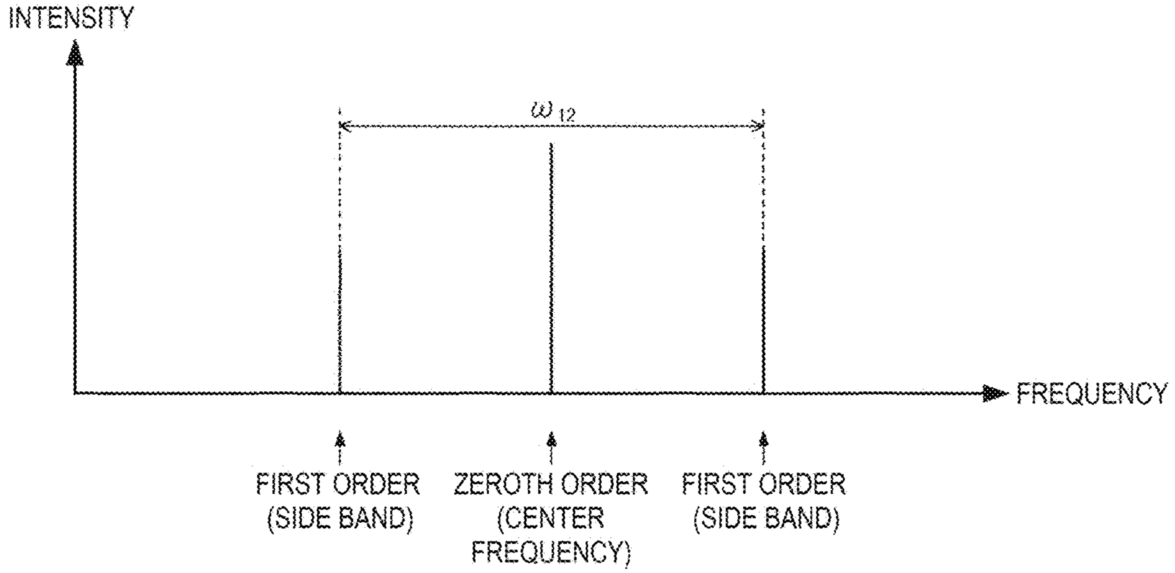
FIG. 4 shows an example of the frequency spectrum of laser light output from a light source shown in FIG. 1.

FIG. 4 shows an example of the frequency spectrum of the laser light L output from the light source 2 shown in FIG. 1. In FIG. 4, the horizontal axis represents the frequency of the laser light L and the vertical axis represents the intensity of the laser light L. For example, when the laser light L has at least two first-order sidebands, causing the difference in frequency $\omega_{1/2}$ between the two sidebands shown in FIG. 4 to coincide with the frequency $\omega_{12}$ corresponding to the difference in energy $\Delta E_{12}$ described above allows the EIT phenomenon described above to occur with one sideband being the first light and the other sideband being the second light, as shown in FIG. 4.

The laser light L containing the first light and the second light described above can be output by modulating the current supplied to the light source 2 shown in FIG. 1. For example, when the light source 2 includes a VCSEL 20 as shown in FIG. 1, a drive current that is the combination of a bias current corresponding to the center frequency in FIG. 4 and a modulation current that fluctuates at a frequency $\omega_{12}/2$ may be supplied to the VCSEL 20.

1.3. Ramsey Resonance

In the atomic oscillator 1 shown in FIG. 1, the laser light PL reflected off the light reflector 4 enters the atomic cell 3. The light reflector 4 changes the angle at which the laser light PL exits and causes the laser light PL to be radiated to the atomic cell 3 at the predetermined cycle. As a result, the laser light PL entering the atomic cell 3 is not continuous-wave laser light but is a pulse-wave laser light.

When the atomic cell 3 is irradiated with the pulse laser light PL, the alkali metal atoms are excited in the form of pulses, and Ramsey resonance occurs. The Ramsey resonance having thus occurred generates Ramsey fringes having a signal shape in which fine vibrations are superimposed on the EIT signal. One peak of the fine vibrations of the Ramsey fringes has a very narrow linewidth and thus has a high Q value. Using the peak of the Ramsey fringes therefore allows further stabilization of the output frequency of the atomic oscillator 1.

There is a phenomenon called a light shift in which the peak frequency of the EIT signal varies due to the intensity of the laser light L that enters the atomic cell 3. The light shift causes a decrease in long-term stability of the output frequency. The peak frequency of the Ramsey fringes, however, has poor sensitivity to the light shift. Therefore, the Ramsey fringes, when allowed to occur in the EIT signal, can also contribute to suppression of the light shift. As a result, the long-term stability of the output frequency of the atomic oscillator 1 can be enhanced.

1.4. Light Source

The light source 2 shown in FIG. 1 includes the vertical cavity surface emitting laser (VCSEL) 20, a drive circuit 22, a frequency multiplier 24, and a gain control circuit 26.

The VCSEL 20, which has a wide current-based modulation band, is useful as a semiconductor laser device used for the light source 2.

The drive circuit 22 generates a drive current that is the combination of a bias current S6 corresponding to the center frequency in FIG. 4 and the modulation signal S2, which fluctuates at the frequency of $\omega_{12}/2$. The drive current is supplied to the VCSEL 20. When the drive current described above is supplied to the VCSEL 20, the VCSEL 20 outputs, in a first period $\tau$, the laser light L having the center frequency corresponding to the bias current S6 and sidebands at frequencies that are separate from the center frequency and correspond to the modulation signal S2, as shown in FIG. 4.

The frequency multiplier 24 multiplies a modulation signal S4 from the control circuit 7 shown in FIG. 1 by a certain factor to generate a signal having a frequency that is half the frequency $\omega_{12}$ corresponding to the difference in energy $\Delta E_{12}$ between the two ground levels shown in FIG. 2. The frequency multiplier 24 then outputs the generated signal as the modulated signal S2. The frequency multiplier 24 is realized, for example, by a phase locked loop (PLL) circuit.

The gain control circuit 26 amplifies the modulation signal S2. The gain control circuit 26 is realized, for example, by an automatic gain control (AGC) circuit.

The light source 2 may include optical elements that are not shown. Examples of the optical elements may include a filter, a lens, and a wave plate. The optical elements are disposed, for example, between the VCSEL 20 and the light reflector 4. Note that the optical elements may be disposed between the light reflector 4 and the atomic cell 3.

1.5. Atomic Cell

The atomic cell 3 shown in FIG. 1 houses multiple kinds of gaseous alkali metal atoms. The inner wall of the atomic cell 3 may be coated with a hydrocarbon film made, for example, of paraffin or octadecyltrichlorosilane (OTS). Part of the laser light PL having entered the atomic cell 3 passes through the atomic cell 3 and detected by the photodetector 5.

The atomic cell 3 may house a buffer gas along with the alkali metal atoms. The buffer gas may, for example, be a rare gas.

A coil that is not shown is provided outside the atomic cell 3. The coil applies a magnetic field in a predetermined direction to the alkali metal atoms housed in the atomic cell 3. The magnetic field allows selection and use of a spectrum (timepiece transition) insensitive, for example, to a change in an external magnetic field, a temperature, or the like, that is, a change in an external environment.

The temperature of the atomic cell 3 may be controlled to a desired temperature by using a temperature control element that is not shown, such as a Peltier element.

1.6. Light Reflector

Figure 5:
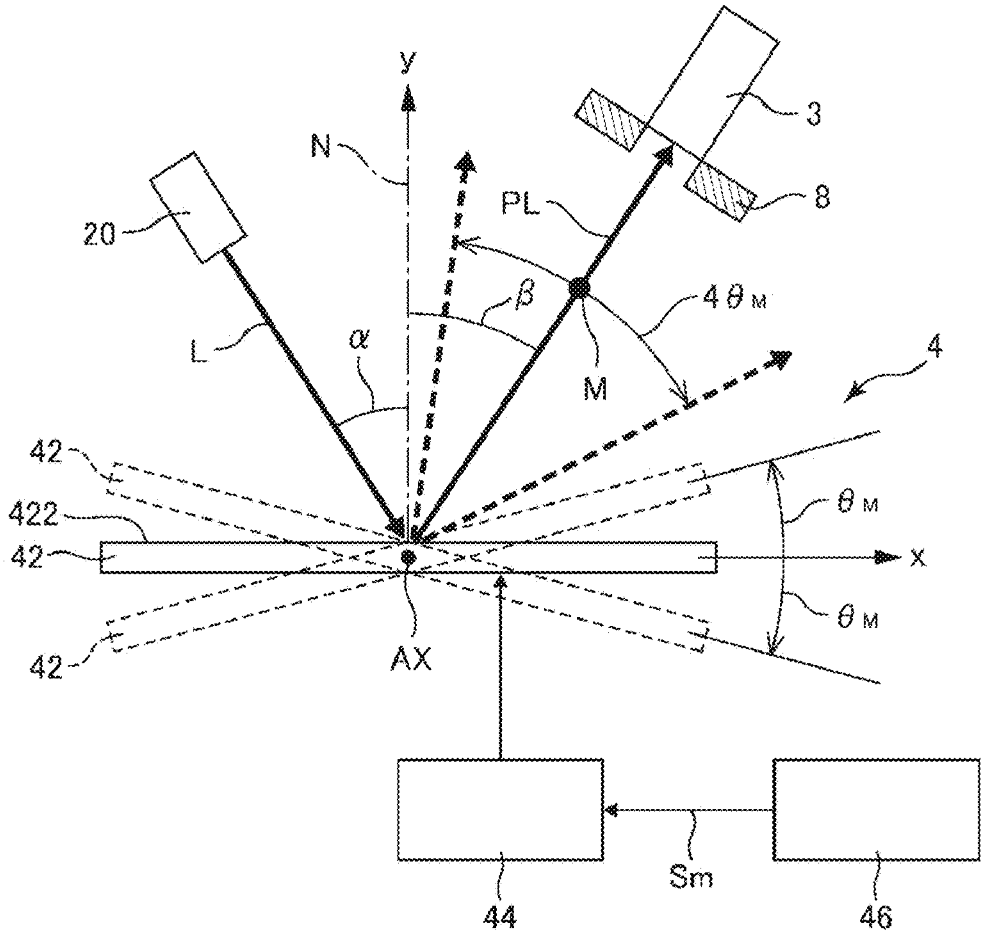
FIG. 5 is a diagrammatic view showing the configuration of a light reflector in FIG. 1.

FIG. 5 is a diagrammatic view showing the configuration of the light reflector 4 in FIG. 1. In FIG. 5 and the figures described later, two axes orthogonal to each other are set and called an x-axis and a y-axis. The axes are each drawn in the form of an arrow, a distal side of the arrow being referred to as a "positive" side, and a proximal side of the arrow being referred to as a "negative" side.

Examples of the light reflector 4 may include a micro-electro-mechanical-systems (MEMS) scanner, a galvanometric scanner, a resonant scanner, and a polygonal scanner. Among the elements described above, a MEMS scanner is preferably used as the light reflector 4. A MEMS scanner includes a mirror formed by using a MEMS technology, and have a size, a weight, and power consumption that are readily reduced.

A light terminal 8 is disposed around a light incident port of the atomic cell 3 shown in FIG. 5. The light terminal 8 is a member that absorbs and terminates the laser light PL that is output from the mirror 42 but does not enter the atomic cell 3. The thus provided light terminal 8 can prevent the laser light PL that has been swept by the light reflector 4 but has not entered the atomic cell 3 from forming stray light. The configuration described above can suppress a decrease in the S/N ratio (signal-to-noise ratio) of the detection signal S3 due to the stray light that detours and enters the atomic cell 3. The light terminal 8 may, for example, be a member made of a light absorbing material. In addition, disposing the light terminal 8 around the light incident port of the atomic cell 3 allows reduction particularly in the effect of the stray light on the atomic cell 3.

The light terminal 8 is not necessarily disposed at the position shown in FIG. 5, and may be disposed at any position.

1.6.1. Configuration of Light Reflector

The light reflector 4 shown in FIG. 5 includes a mirror 42, a mirror driver 44, and a mirror driving controller 46.

The mirror 42 shown in FIG. 5 has a reflection surface 422, which reflects the laser light L incident at an angle of incidence a. A normal to the reflection surface 422 is labeled with N. The reflection surface 422 in a stationary posture (posture in natural state in which the reflection surface 422 is not driven by the mirror driver 44) is so set that the normal N thereto is parallel to the y-axis. In this case, the reflection surface 422 is parallel to the x-axis.

The mirror 42 swings around an axis of pivotal motion AX. The posture of the mirror 42 thus changes, so that an angle of reflection β, at which the laser light L is reflected off the reflection surface 422, can be changed. As a result, the laser light PL output from the reflection surface 422 is swept over a range of paths passing through the light incident port of the atomic cell 3. The laser light PL is therefore allowed to enter the atomic cell 3 at a predetermined cycle. The axis of pivotal motion AX shown in FIG. 5 is an axis orthogonal to both the x-axis and the y-axis.

Using the light reflector 4 allows the optical path of the laser light L to be reliably changed. That is, the state of the laser light L can be reliably switched between a state in which the atomic cell 3 is irradiated with the laser light PL and a state in which the atomic cell 3 is not irradiated with the laser light PL. Therefore, during the time frame in which the laser light PL is not oriented toward the atomic cell 3, the probability of entry of the stray light into the atomic cell 3 can be sufficiently reduced. As a result, the extinction ratio of the laser light PL with which the atomic cell 3 is irradiated can be sufficiently increased. The improvement in the extinction ratio results in an increase in the S/N ratio of the pulse laser light PL, and contributes to stable occurrence of the Ramsey resonance and a stable output frequency of the atomic oscillator 1.

The mirror driver 44 changes the posture of the mirror 42 with respect to the laser light L by causing the mirror 42 to swing around the axis of pivotal motion AX based on a mirror driving signal Sm input to the mirror driver 44. The angle of reflection β of the laser light L can thus be quickly switched to a desired angle. As a result, the pulse width and the cycle of the laser light PL can be freely controlled.

The operation mode of the mirror driver 44 includes a resonance mode and a non-resonance mode. The non-resonant mode is preferably used out of the two modes. In the non-resonance mode, the angle of pivotal motion of the mirror 42 can be precisely controlled. The pulse width and the cycle of the laser light PL can thus be controlled with precision.

The method for operating the mirror driver 44 is not limited to a specific method, and may, for example, be an electrostatic method, a piezoelectric method, and an electromagnetic method.

In the electrostatic method, for example, an electrode that is not shown is disposed on the side opposite the reflection surface 422 of the mirror 42, and the mirror 42 is driven by an electrostatic force generated by the electrode. In the piezoelectric method, the mirror 42 is driven by a piezoelectric actuator. In the electromagnetic method, the mirror 42 is driven by a Lorentz force generated by a magnetic field generated by a magnet and a current flowing through a coil.

The mirror driving controller 46 outputs the mirror driving signal Sm to the mirror driver 44. The mirror driving signal Sm is a signal having a cyclic waveform such as a sinusoidal wave, a rectangular wave, or a triangular wave. When the mirror driving signal Sm is input, the mirror driver 44 changes the posture of the mirror 42 at a cycle corresponding to the frequency of the mirror driving signal Sm. The mirror driving controller 46 is realized, for example, by any reference signal generator. The cycle corresponding to the frequency of the mirror driving signal Sm refers, for example, to a cycle corresponding to an integral multiple of the frequency of the mirror driving signal Sm. According to the configuration described above, the laser light PL can be converted into pulse laser light having a stable pulse width and cycle.

1.6.2. Conditions Under which Light Reflector Operates

Conditions under which the light reflector 4 operates will next be described.

1.6.2.1. Angle of Incidence

Figure 6:
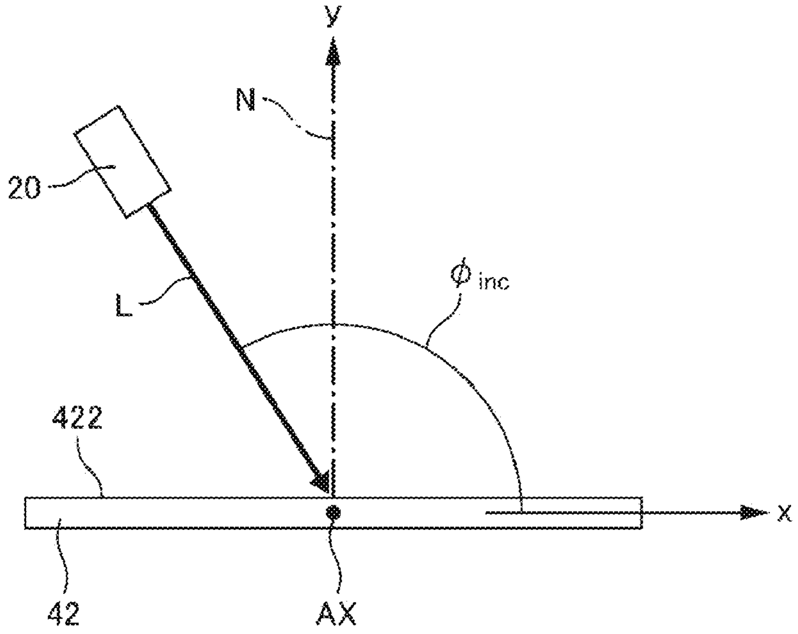
FIG. 6 is a conceptual view illustrating an allowable range of the angle of incidence at which the laser light is incident on the light reflector.

FIG. 6 is a conceptual view illustrating an allowable range of the angle of incidence a, at which the laser light L is incident on the light reflector 4.

An angle $\varphi_{inc}$ shown in FIG. 6 is an angle between the optical axis of the laser light L incident on the reflection surface 422 and a plane containing the positive side of the x-axis. The range of the angle $\varphi_{inc}$, at which the laser light L is reflected off the reflection surface 422, is expressed by Expression (1) below.

$$90° < \varphi_{inc} < 180° - \theta_M \quad (1)$$

Note that $\theta_M$ in Expression (1) described above is the maximum of the angle of pivotal motion of the mirror 42 shown in FIG. 5. When the angle $\varphi_{inc}$ is smaller than the lower limit in Expression (1), it is difficult to cause the reflected laser light PL to enter the atomic cell 3. When the angle $\varphi_{inc}$ is greater than the upper limit in Expression (1), the laser light L cannot be incident on the reflection surface 422.

The angle $\varphi_{inc}$ and the angle of incidence a satisfy Expression (2) below.

$$\varphi_{inc} = \alpha + 90° \quad (2)$$

Expression (1) described above is then expressed by Expression (3) below.

$$0° < \alpha < 90° - \theta_M \tag{3}$$

To set the angle of incidence a, the allowable range expressed by Expression (3) described above only needs to be satisfied.

It is preferable that the angle of incidence a satisfies the allowable range expressed by Expression (3a) described below in addition to the allowable range expressed by Expression (3) described above.

$$\theta_M < \alpha \tag{3a}$$

Satisfying the expressions described above can prevent the laser light L reflected off the reflection surface 422 from traveling back along the optical axis of the incident laser light L. As a result, entry of the return light into the light source 2 can be prevented, so that unstable operation of the light source 2 can be prevented.

1.6.2.2 Angle of Reflection

Figure 7:
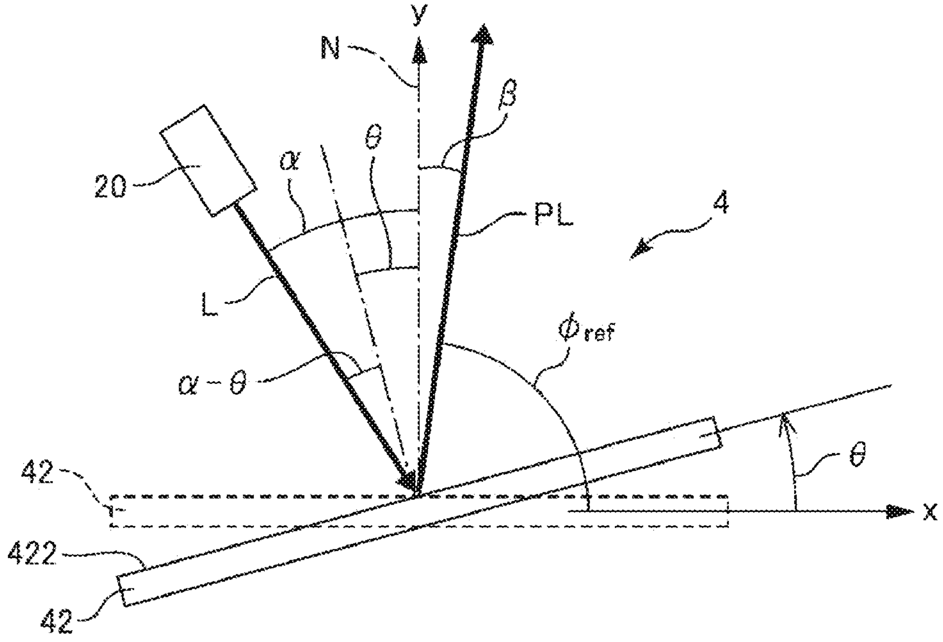
FIG. 7 is a conceptual view illustrating an allowable range of the angle of reflection at which the laser light is reflected off the light reflector.

FIG. 7 is a conceptual view illustrating an allowable range of the angle of reflection β, at which the laser light L is reflected off the light reflector 4.

Let θ be the angle of pivotal motion of the mirror 42 shown in FIG. 7, and the angle of incidence at which the laser light L is incident on the reflection surface 422 is α−θ. An angle $\varphi_{ref}$ shown in FIG. 7 is an angle between the optical axis of the laser light PL output from the reflection surface 422 and a plane containing the positive side of the x-axis. The angle $\varphi_{ref}$ is then expressed by Expression (4) below.

$$\varphi_{ref} = 90° + \theta - (\alpha - \theta) = 90° + 2\theta - \alpha \tag{4}$$

Expression (5) below is derived from Expressions (3) and (4) described above by using $\theta_M$, which is the maximum of the angle of pivotal motion θ.

$$90° - 2\theta_M - \alpha < \varphi_{ref} < 90° + 2\theta_M - \alpha \tag{5}$$

The angle $\varphi_{ref}$ and the angle of reflection β shown in FIG. 7 satisfy Expression (6) below.

$$\varphi_{ref} = 90° - \beta \tag{6}$$

Expression (5) described above is then expressed by Expression (7) below.

$$\alpha - 2\theta_M < \beta < \alpha + 2\theta_M \tag{7}$$

To set the angle of reflection β, the allowable range expressed by Expression (7) described above only needs to be satisfied.

Note that Expression (7) described above shows that the amplitude of the angle of reflection β, that is, the angle of swing motion of the laser light PL is $4\theta_M$. The light reflector 4 can sweep the laser light PL at the angle of swing motion $4\theta_M$ shown in FIG. 5.

1.6.2.3. Pulse Width and Pulse Interval

Figure 8:
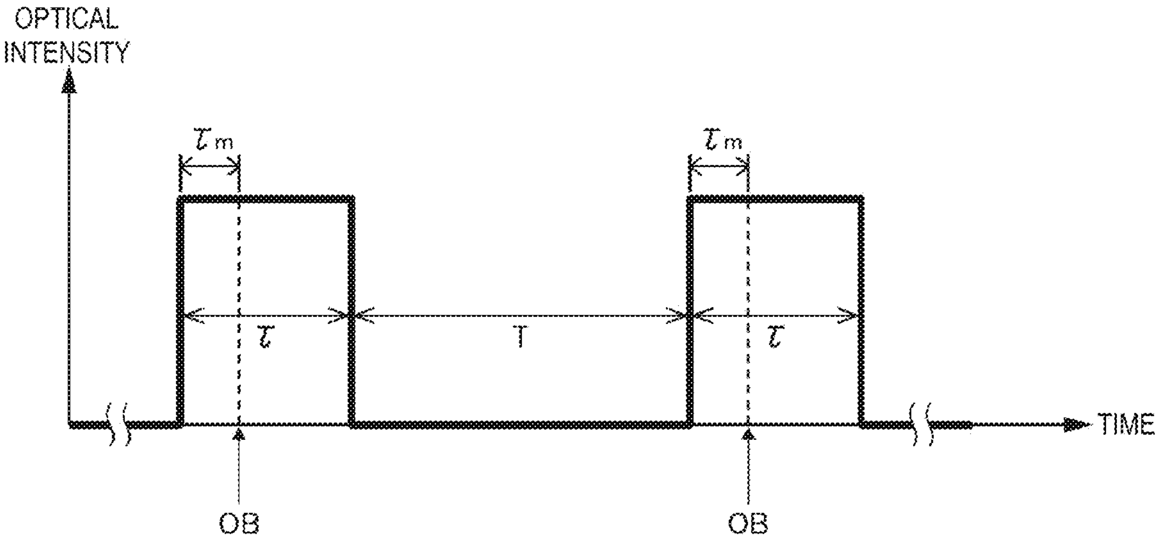
FIG. 8 is a conceptual view showing a temporal change in the optical intensity of the laser light that enters an atomic cell.

FIG. 8 is a conceptual view showing a temporal change in the optical intensity of the laser light PL that enters the atomic cell 3.

When the laser light PL is swept by the light reflector 4, the optical intensity of the laser light PL that enters the atomic cell 3 changes in the form of a pulse wave, as shown in FIG. 8. In the change in the optical intensity shown in FIG. 8, the first period τ, in which the optical intensity is relatively high, and a second period T, in which the optical intensity is relatively low, are alternately repeated.

The first period T is a period (pulse width) for which the swept laser light PL enters the atomic cell 3. The length of the first period τ can be adjusted, for example, by changing the speed at which the laser light PL is swept, the angle of swing motion $4\theta_M$ of the laser light PL, the size of the light incident port of the atomic cell 3, and the size of the opening of the light terminal 8.

The photodetector 5 detects the intensity of the laser light PL after a period $\tau_m$ elapses from the start of the first period T (pulse rising timing). The detection timing is referred to as an observation timing OB. After the observation timing OB, the alkali metal atoms are excited until the end of the first period T (end of pulse). The second period T is a free evolution time (pulse interval) during which the laser light PL does not enter the atomic cell 3. Alternately repeating the first period T and the second period T described above allows the Ramsey resonance to occur.

The linewidth of the Ramsey fringes changes in accordance with the length of the second period T shown in FIG. 8. Specifically, the full width at half maximum γ of the peak contained in the Ramsey fringes is expressed by Expression (8).

$$\gamma = \frac{1}{2T} \tag{8}$$

In view of Expression (8) described above, the linewidth of the Ramsey fringes can be narrowed by lengthening the second period T. The output frequency of the atomic oscillator 1 can thus be further stabilized. The length of the second period T can be adjusted, for example, by changing the speed at which the laser light PL is swept, the angle of swing motion $4\theta_M$ of the laser light PL, the size of the light incident port of the atomic cell 3, and the size of the opening of the light terminal 8.

The method for adjusting the first period τ and the second period T is categorized as follows in accordance with the relationship between the size of the light incident port of the atomic cell 3 and the beam diameter of the laser light PL.

(a) a Case where the Beam Diameter of the Laser Light PL is Smaller than the Light Incident Port of the Atomic Cell 3

Figure 9:
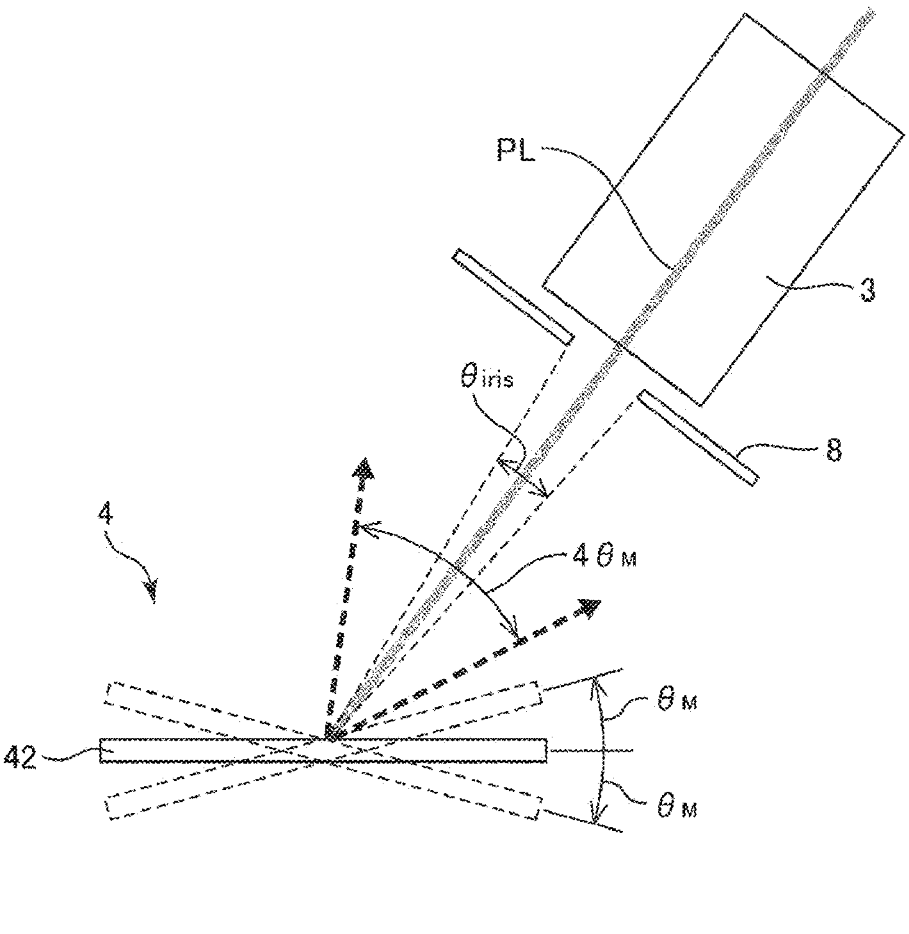
FIG. 9 is a diagrammatic view showing the atomic cell and the light reflector in a case where the beam diameter of the laser light is smaller than a light incident port of the atomic cell.

FIG. 9 is a diagrammatic view showing the atomic cell 3 and the light reflector 4 in a case where the beam diameter of the laser light PL is smaller than the light incident port of the atomic cell 3.

In this case, it is preferable to restrict the angular range of the laser light PL that can enter the atomic cell 3 by disposing the light terminal 8, as shown in FIG. 9. In this case, the first period τ and the second period T can be adjusted based on a ratio ($\theta_{iris}/4\theta_M$) of an opening angle $\theta_{iris}$ of the light terminal 8 to the angle of swing motion $4\theta_M$ of the laser light PL. The first period $\tau$ and the second period T can thus be relatively readily adjusted without adjusting the size of the atomic cell 3.

(B) a Case where the Beam Diameter of the Laser Light PL is Greater than the Light Incident Port of the Atomic Cell 3

Figure 10:
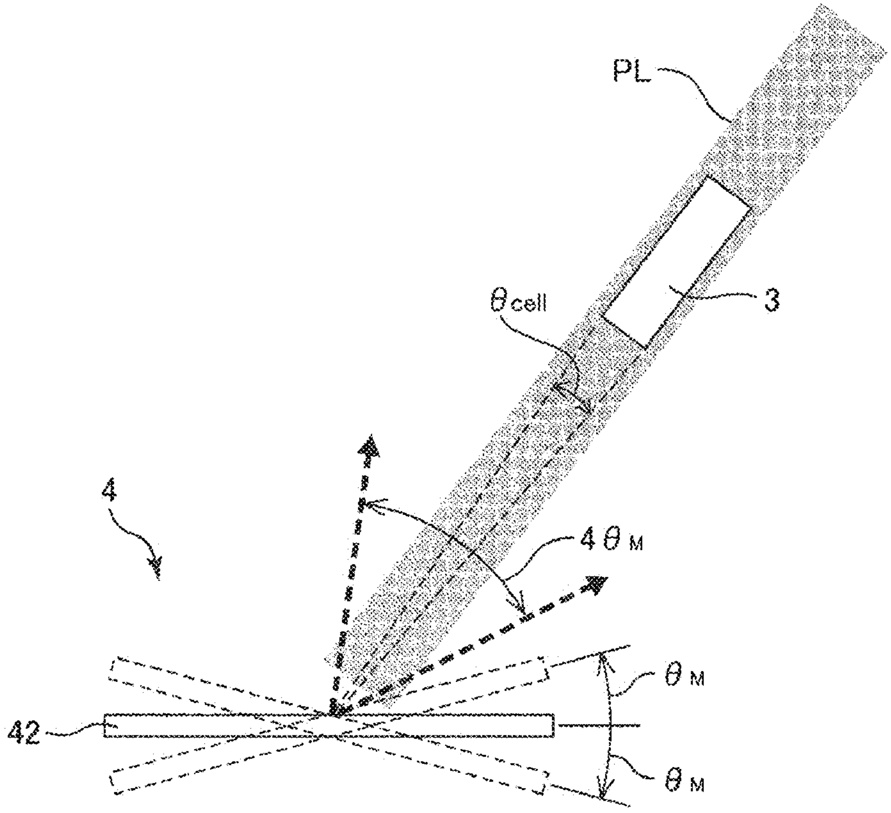
FIG. 10 is a diagrammatic view showing the atomic cell and the light reflector in a case where the beam diameter of the laser light is greater than the light incident port of the atomic cell.

FIG. 10 is a diagrammatic view showing the atomic cell 3 and the light reflector 4 in a case where the beam diameter of the laser light PL is greater than the light incident port of the atomic cell 3.

In this case, the entire beam of the laser light PL does not enter the atomic cell 3, and only part of the beam diameter of the laser light PL enters the atomic cell 3, as shown in FIG. 10. Therefore, in this case, the first period $\tau$ and the second period T can be adjusted based on the ratio ($\theta_{cell}/4\theta_M$) of an opening angle $\theta_{cell}$ of the light incident port of the atomic cell 3 to the angle of swing motion $4\theta_M$ of the laser light PL.

1.6.2.4. Position of Atomic Cell with Respect to Angle of Swing Motion

The atomic cell 3 only needs to be disposed within the angle of swing motion $4\theta_M$, and may be disposed, for example, at an intermediate point M shown in FIG. 5. The intermediate point M is a position where the bisector of the angle of swing motion $4\theta_M$ and the center line of the atomic cell 3 overlap with each other. In this case, the pulse frequency of the laser light PL that enters the atomic cell 3 is twice the frequency of the mirror driving signal Sm. Furthermore, variation in the length of the second period T can be suppressed as compared with a case where the atomic cell 3 is disposed at a position other than the intermediate point M. Distortion of the Ramsey fringes can thus be suppressed, so that the instability of the output frequency of the atomic oscillator 1 can be suppressed.

The atomic cell 3 may instead be disposed at an end of the angle of swing motion $4\theta_M$. In this case, the pulse frequency of the laser light PL that enters the atomic cell 3 is equal to the frequency of the mirror driving signal Sm.

Figure 11:
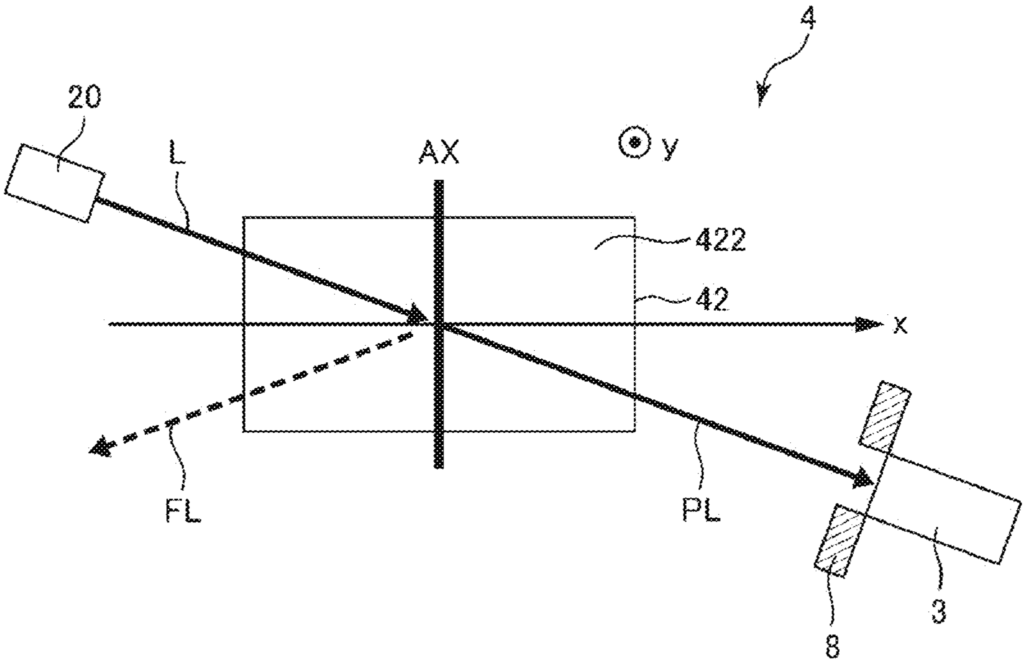
FIG. 11 is a diagrammatic view showing the relationship between the axis of pivotal motion of a mirror and the optical axis along which the laser light is incident on a reflection surface.

1.6.2.5. Relationship of Optical Axis of Incident Light with Axis of Pivotal Motion FIG. 11 is a diagrammatic view showing the relationship between the axis of pivotal motion AX of the mirror 42 and the optical axis along which the laser light L is incident on the reflection surface 422. Note that FIG. 11 is a plan view viewed along the normal N to the reflection surface 422 that is not swinging. In FIG. 11, the optical axis of the incident laser light L and the optical axis of the reflected laser light PL are projected onto the reflection surface 422.

Depending on the angle of pivotal motion of the mirror 42, the laser light L reflected off the reflection surface 422 may travel back as return light along the optical axis of the incident laser light L. In particular, when the optical axis of the incident laser light L projected onto the reflection surface 422 is orthogonal to the axis of pivotal motion AX, the optical axis of the return light coincides with the optical axis of the incident laser light L, so that the return light may reach the light source 2.

To avoid the situation described above, the optical axis of the incident laser light L projected onto the reflection surface 422 is set in FIG. 11 so as to obliquely intersect with the axis of pivotal motion AX. According to the configuration described above, even when the return light FL is produced, the situation in which the optical axis of the return light FL coincides with the optical axis of the incident laser light L can be prevented. The situation in which the return light FL reaches the light source 2 can therefore be prevented.

1.7. Photodetector

The photodetector 5 shown in FIG. 1 detects the laser light PL having passed through the atomic cell 3 and outputs a current signal according to the intensity of the laser light PL as the detection signal S3. The photodetector 5 is realized, for example, by a photodiode.

1.8. Frequency Oscillator

The frequency oscillator 6 shown in FIG. 1 outputs the oscillation signal S1. The control circuit 7, which will be described later, performs feedback control to lock the frequency of the oscillation signal S1 at the peak of the Ramsey fringes contained in the detection signal S3. The output frequency of the oscillation signal S1 can thus be stabilized. As a result, for example, the atomic oscillator 1 capable of outputting a high-quality clock signal can be realized.

Examples of the frequency oscillator 6 may include a voltage controlled oscillator (VCO), a voltage controlled crystal oscillator (VCXO), and a temperature compensated crystal oscillator (TCXO).

The frequency oscillator 6 oscillates, for example, at a frequency of about several megahertz to several tens of megahertz.

1.9. Control Circuit

The control circuit 7 shown in FIG. 1 includes a current-voltage conversion circuit 72, a first detection circuit 74, a first modulation circuit 76, a first low-frequency oscillator 78, a second detection circuit 84, a second modulation circuit 86, a second low-frequency oscillator 88, and a frequency conversion circuit 89.

The current-voltage conversion circuit 72 converts the detection signal S3, which is a current signal, into a voltage signal. The detection signal S3 output from the current-voltage conversion circuit 72 is input to the first detection circuit 74 and the second detection circuit 84.

In the first period $\tau$, the first detection circuit 74 synchronously detects the detection signal S3 output from the current-voltage conversion circuit 72 by using a signal output from the first low-frequency oscillator 78. The first detection circuit 74 thus outputs a positive or negative error signal according to a difference in frequency from the center frequency as a first detection signal S5. The first low-frequency oscillator 78 oscillates at a low frequency ranging, for example, from about several tens of kilohertz to about several hundreds of kilohertz.

The first modulation circuit 76 uses the signal output from the first low-frequency oscillator 78 to modulate the first detection signal S5. The first detection circuit 74 can thus perform the detection. A bias current S6 supplied to the light source 2 is then so controlled that the maximum of the peak contained in the detection signal S3 is held.

In the first period $\tau$, the second detection circuit 84 synchronously detects the detection signal S3 output from the current-voltage conversion circuit 72 by using a signal output from the second low-frequency oscillator 88. The second detection circuit 84 thus outputs a positive or negative error signal according to a difference in frequency from the center frequency as a second detection signal S7. The frequency of the oscillation signal S1 output from the frequency oscillator 6 is then subjected to fine adjustment in accordance with the voltage value of the second detection signal S7.

The second modulation circuit 86 uses the signal output from the second low-frequency oscillator 88 to modulate the oscillation signal S1. The second detection circuit 84 can thus perform the detection. The operation of the light source 2 is then so controlled that the difference in frequency between the first light and the second light contained in the laser light L coincides with the frequency $\omega_{12}$ corresponding to the difference in energy $\Delta E_{12}$ described above. Specifically, the modulation signal S2 supplied to the light source 2 is controlled. The modulation signal S2 is a signal corresponding to the oscillation signal S1 output from the frequency oscillator 6. The EIT phenomenon is thus allowed to occur in a stable manner. The second modulation circuit 86 can be realized, for example, by a frequency mixer, a frequency modulation (FM) circuit, or an amplitude modulation (AM) circuit.

The light source 2 described above then outputs laser light L containing first light and second light having frequencies different from each other based on the modulation signal S2 corresponding to the oscillation signal S1.

The frequency conversion circuit 89 converts the frequency of the oscillation signal S1 into a freely selected frequency and outputs the converted oscillation signal S1, for example, as a clock signal. The oscillation signal S1 has extremely high frequency precision and frequency stability based on the peak frequency of the Ramsey fringes having a high Q value resulting from the Ramsey resonance. The atomic oscillator 1 capable of outputting a high-quality clock signal can thus be realized.

2. Variation

An atomic oscillator according to a variation of the embodiment described above will next be described.

In the embodiment described above, the laser light L contains light having two sidebands, and the light having two sidebands is controlled to form the first light and the second light, as shown in FIG. 4.

In the variation, one of the light having the center frequency and contained in the laser light L and the light having two sidebands is controlled to form the first light and the second light described above. The variation described above can also provide the same advantages as those provided by the embodiment described above.

3. Frequency Signal Generation System

A clock transmission system 90 (timing server) will next be described as the frequency signal generation system according to the embodiment.

Figure 12:
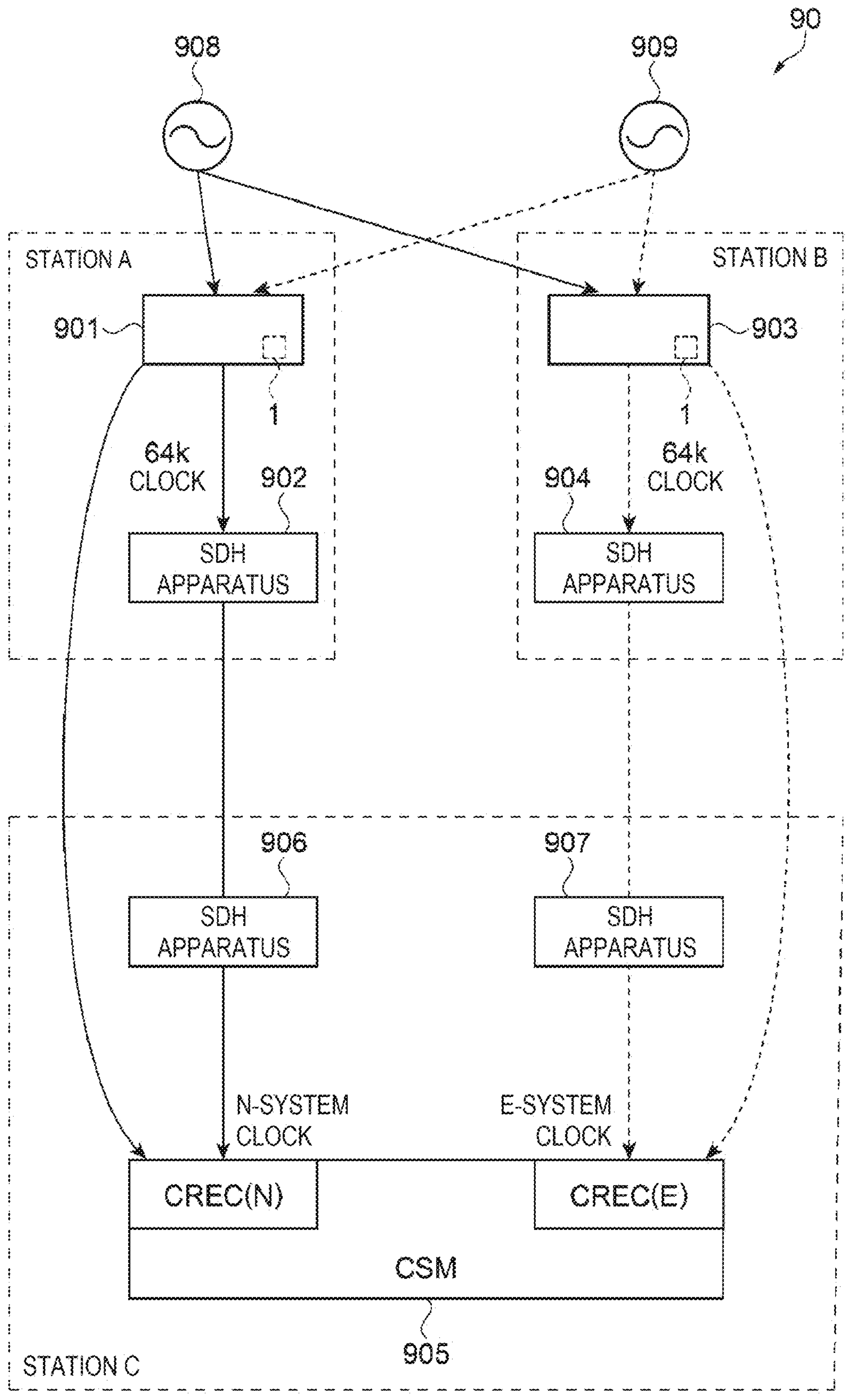
FIG. 12 is a schematic configuration diagram showing a clock transmission system as a frequency signal generation system according to the embodiment.

FIG. 12 is a schematic configuration diagram showing the clock transmission system 90 as the frequency signal generation system according to the embodiment.

The clock transmission system 90 shown in FIG. 12 is a system that provides a unified clock for apparatuses in a time-division multiplexing network, and has a redundant configuration including an N-system (normal system) and an E-system (emergency system).

The clock transmission system 90 includes a clock supplier 901 and an SDH (synchronous digital hierarchy) apparatus 902, which belong to an N-system, high-hierarchy station A, a clock supplier 903 and an SDH apparatus 904, which belong to an E-type, high-hierarchy station B, and a clock supplier 905 and SDH apparatuses 906 and 907, which belong to a low-hierarchy station C. The clock supplier 901 includes the atomic oscillator 1, and generates an N-system clock signal. The atomic oscillator 1 in the clock supplier 901 generates a clock signal in synchronization with a more precise clock signal from master clocks 908 and 909 each including a cesium-based atomic oscillator. Note that the clock suppliers 901 and 903 correspond to a processor that processes a frequency signal from the atomic oscillator 1.

The SDH apparatus 902 transmits and receives a primary signal based on the clock signal from the clock supplier 901, superimposes the N-system clock signal on the primary signal, and transmits the resultant signal to the low-hierarchy clock supplier 905. The clock supplier 903 includes the atomic oscillator 1, and generates an E-system clock signal. The atomic oscillator 1 in the clock supplier 903 generates a clock signal in synchronization with the more precise clock signal from the master clocks 908 and 909 each including a cesium-based atomic oscillator.

The SDH apparatus 904 transmits and receives a primary signal based on the clock signal from the clock supplier 903, superimposes the E-system clock signal on the primary signal, and transmits the resultant signal to the low-hierarchy clock supplier 905. The clock supplier 905 receives the clock signals from the clock suppliers 901 and 903, and generates a clock signal in synchronization with the received clock signals.

The clock supplier 905 normally generates the clock signal in synchronization with the N-system clock signal from the clock supplier 901. When abnormality occurs in the N system, the clock supplier 905 generates the clock signal in synchronization with the E-system clock signal from the clock supplier 903. Switching the system in operation from the N system to the E system as described above ensures stable clock supply and an increase in reliability of the clock path network. The SDH apparatus 906 transmits and receives the primary signal based on the clock signal from the clock supplier 905. Similarly, the SDH apparatus 907 transmits and receives the primary signal based on the clock signal from the clock supplier 905. The apparatuses in the station C can be synchronized with the apparatuses in the station A or the station B.

The frequency signal generation system according to the present embodiment is not limited to the clock transmission system 90. The frequency signal generation system includes a system including various apparatuses (processors) that each incorporate the atomic oscillator 1 and process and use the clock signal (output signal) output from the atomic oscillator 1. The system described above, which includes the atomic oscillator 1 having excellent frequency stability, has excellent reliability.

The frequency signal generation system according to the present embodiment may, for example, be a smartphone, a tablet terminal, a timepiece, a portable phone, a digital still camera, a liquid ejector such as an inkjet printer, a personal computer, a television, a video camcorder, a video tape recorder, a car navigator, a pager, an electronic notebook, an electronic dictionary, a calculator, an electronic game console, a word processor, a workstation, a videophone, a security television monitor, a pair of electronic binoculars, a point of sales (POS) terminal, a medical instrument, a fish finder, a global navigation satellite system (GNSS) frequency gauge, various measuring instruments, meters, a flight simulator, a terrestrial digital broadcasting system, a portable phone base station, and a moving object. Examples of the moving object may include an automobile, an aircraft, and a ship.

4. Advantages Provided by Embodiment Described Above

The atomic oscillator 1 according to the embodiment described above includes the frequency oscillator 6, the light source 2, the atomic cell 3, the light reflector 4, the photodetector 5, and the control circuit 7. The frequency oscillator 6 outputs the oscillation signal S1. The light source 2 outputs the laser light L containing first light and second light having frequencies different from each other based on the modulation signal S2 corresponding to the oscillation signal S1. The atomic cell 3 encapsulates the alkali metal atoms. The light reflector 4 includes the mirror 42, which changes the angle of reflection β of the laser light L, and causes the laser light L reflected off the mirror 42 (laser light PL) to enter the atomic cell 3 at the predetermined cycle. The photodetector 5 detects the laser light PL having passed through the atomic cell 3 and outputs the detection signal S3 according to the intensity of the laser light PL. The control circuit 7 controls the operation of the frequency oscillator 6 based on the detection signal S3 to adjust the frequency of the oscillation signal S1 so that the alkali metal atoms cause the electromagnetically induced transparency (EIT) phenomenon to occur.

According to the configuration described above, changing the angle of reflection β of the laser light L allows the state of the system to be reliably switched between the state in which the atomic cell 3 is irradiated with the laser light PL and the state in which the atomic cell 3 is not irradiated with the laser light PL. Therefore, during the time frame in which the laser light PL is not oriented toward the atomic cell 3, the probability of entry of the stray light into the atomic cell 3 can be sufficiently reduced. As a result, the extinction ratio of the laser light PL with which the atomic cell 3 is irradiated can be sufficiently increased. The improvement in the extinction ratio contributes to stable occurrence of the Ramsey resonance and stable output frequency of the atomic oscillator 1.

In the atomic oscillator 1 according to the embodiment described above, the light reflector 4 includes the mirror 42 and the mirror driver 44, which changes the posture of the mirror 42 with respect to the laser light L.

According to the configuration desired above, the angle of reflection β of the laser light L can be quickly switched to a desired angle. As a result, the pulse width and the cycle of the laser light PL can be freely controlled.

In the atomic oscillator 1 according to the embodiment described above, the light reflector 4 includes the mirror driving controller 46, which outputs the mirror driving signal Sm having a predetermined frequency. The mirror driver 44 changes the posture of the mirror 42 at a cycle corresponding to the frequency of the mirror driving signal Sm.

According to the configuration described above, the laser light PL can be converted into pulse laser light having a stable pulse width and cycle.

In the atomic oscillator 1 according to the embodiment described above, the light reflector 4 is a MEMS scanner.

According to the configuration described above, the atomic oscillator 1 that readily allows reduction in size, weight, and power consumption can be realized.

In the atomic oscillator 1 according to the embodiment described above, the mirror 42 swings around the axis of pivotal motion AX to change the angle of reflection β of the laser light L.

According to the configuration desired above, the angle of reflection β of the laser light L can be quickly switched to a desired angle. As a result, the pulse width and the cycle of the laser light PL can be freely controlled.

In the atomic oscillator 1 according to the embodiment described above, the light reflector 4 satisfies $\theta_M<\alpha$ in operation, where a represents the angle of incidence of the laser light L with respect to the normal N to the reflection surface 422 of the mirror 42 that is not swinging, and $\theta_M$ represents the maximum of the angle of pivotal swing motion.

The configuration desired above can be prevent a situation in which the laser light L is reflected off the reflection surface 422 and then travels back along the optical axis of the incident laser light L. As a result, entry of the return light into the light source 2 can be prevented, so that unstable operation of the light source 2 can be prevented.

In the atomic oscillator 1 according to the embodiment described above, the control circuit 7 controls the operation of the light source 2 in such a way that the difference in frequency between the first light and the second light coincides with the frequency $\omega_{12}$ corresponding to the difference in energy $\Delta E_{12}$ between the two ground levels of the alkali metal atoms.

According to the configuration described above, the EIT phenomenon is allowed to occur in a stable manner.

In the atomic oscillator 1 according to the embodiment described above, the light source 2 includes the VCSEL 20 (semiconductor laser device) and the frequency multiplier 24. The VCSEL 20 outputs the laser light L based on the modulation signal S2. The frequency multiplier 24 multiplies the frequency of the modulation signal S4 (signal output from control circuit 7) by a certain factor to generate the modulation signal S2.

The configuration described above allows generation of a signal having a frequency that is half the frequency $\omega_{12}$ corresponding to the difference in energy $\Delta E_{12}$ between the two ground levels of the alkali metal atoms. The EIT phenomenon is thus allowed to occur in a stable manner.

The atomic oscillator 1 according to the embodiment described above includes the light terminal 8. The light terminal 8 terminates the laser light PL that is output from the mirror 42 but does not enter the atomic cell 3.

The configuration described above can prevent the laser light PL that has not entered the atomic cell 3 out of the laser light PL swept by the light reflector 4 from forming stray light. The configuration described above can suppress a decrease in the S/N ratio (signal-to-noise ratio) of the detection signal S3 due to the stray light that detours and enters the atomic cell 3.

The frequency signal generation system according to the embodiment described above includes the atomic oscillator 1 according to the embodiment described above, and the processor that processes the output signal (clock signal) output from the atomic oscillator 1.

According to the configuration described above, a frequency signal generation system having excellent reliability is provided.

As described above, the atomic oscillator and the frequency signal generation system according to the present disclosure have been described based on the embodiment shown in the drawings, but the atomic oscillator and the frequency signal generation system according to the present disclosure are not limited to the embodiment and the variations thereof described above, and the configuration of each portion may be replaced with any configuration, or any other configuration may be added.

What is claimed is:

1. An atomic oscillator comprising:

a frequency oscillator configured to output an oscillation signal;

a light source configured to output incident laser light containing first light and second light having frequencies different from each other based on a modulation signal corresponding to the oscillation signal;

an atomic cell configured to encapsulate alkali metal atoms;

a light reflector including a mirror configured to change an angle of reflection of the incident laser light and configured to cause reflected laser light reflected off the mirror to enter the atomic cell at a predetermined cycle;

a photodetector configured to detect transmitted laser light that is reflected light passing through the atomic cell and output a detection signal corresponding to an intensity of the transmitted laser light; and a control circuit configured to control operation of the frequency oscillator based on the detection signal to adjust a frequency of the oscillation signal so that the alkali metal atoms cause an electromagnetically induced transparency phenomenon to occur, wherein the light reflector includes:

a mirror driver configured to change a posture of the mirror with respect to the incident laser light; and a mirror driving controller configured to output a mirror driving signal having a predetermined frequency, and the mirror driver is configured to change the posture of the mirror at a cycle corresponding to a frequency of the mirror driving signal.

2. The atomic oscillator according to claim 1, wherein the light reflector is a MEMS scanner.

3. The atomic oscillator according to claim 1, wherein the mirror is configured to swing around an axis of pivotal motion to change the angle of reflection of the incident laser light.

4. The atomic oscillator according to claim 3, wherein the light reflector satisfies $\theta_M<\alpha$ in operation, where a represents an angle of incidence of the incident laser light with respect to a normal to a reflection surface of the mirror that is not swinging, and $\theta_M$ represents a maximum of an angle of the pivotal swing motion.

5. The atomic oscillator according to claim 1, wherein the control circuit is configured to control operation of the light source in such a way that a difference in frequency between the first light and the second light coincides with a frequency corresponding to a difference in energy between two ground levels of the alkali metal atoms.

6. The atomic oscillator according to claim 1, wherein the light source includes:

a semiconductor laser device configured to output the incident laser light based on the modulation signal; and a frequency multiplier configured to multiply a frequency of a signal output from the control circuit by a certain factor to generate the modulation signal.

7. The atomic oscillator according to claim 1, further comprising:

a light terminal configured to terminate a portion of the reflected laser light that is output from the mirror but does not enter the atomic cell.

8. A frequency signal generation system comprising:

the atomic oscillator according to claim 1; and a processor configured to process an output signal output from the atomic oscillator.

* * * * *